(12) United States Patent
Komatsu (10) Patent No.: US 6,201,736 B1
(45) Date of Patent: Mar. 13, 2001

(54) FLASH MEMORY WITH COPY AND TRANSFER FUNCTION

(75) Inventor: Koichi Komatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/572,087

(22) Filed: May 17, 2000

(30) Foreign Application Priority Data

Jun. 16, 1999 (JP) .................................. 11-169276

(51) Int. Cl.[7] .................................. G11C 16/16
(52) U.S. Cl. .................. 365/185.12; 365/185.11; 365/185.29; 365/185.33
(58) Field of Search .......... 365/185.11, 185.12, 365/185.22, 185.29, 185.33

(56) References Cited

U.S. PATENT DOCUMENTS

| | | | |
|---|---|---|---|
| 4,253,059 | * | 2/1981 | Bell et al. ............................ 714/721 |
| 4,779,272 | * | 10/1988 | Kohda et al. ..................... 365/185.2 |
| 4,870,618 | * | 9/1989 | Iwashita .......................... 365/185.18 |

FOREIGN PATENT DOCUMENTS

| | | | |
|---|---|---|---|
| 5-282883 | 10/1993 | (JP) | ............................... G11C/16/06 |
| 7-235193 | 9/1995 | (JP) | ............................... G11C/16/06 |
| 9-161491 | 6/1997 | (JP) | ............................... G11C/16/06 |

* cited by examiner

*Primary Examiner*—Andrew Q. Tran
(74) *Attorney, Agent, or Firm*—Arent, Fox, Kintner, Plotkin and Kahn, PLLC

(57) ABSTRACT

According to the present invention, a flash memory, having a plurality of non-volatile memory cells, comprises: a plurality of cell blocks CBL having the plurality of non-volatile memory cells, a data latch circuit 20, connected to said cell blocks, for storing data that is read from or written to a selected cell block. The flash memory further includes a control circuit 16 for, in response to an external copy command, erasing a copy destination cell block, reading data from a copy source cell block to store the data in said data latch circuit, and writing the stored data to said copy destination cell block. In the flash memory, when the system gives the address of the copy source cell block and the address of the copy destination cell block, checking and erasing of the copy destination cell block required for copying, reading of data from the copy source cell block and writing that data to the copy destination cell block are performed automatically inside the memory. In addition to the conventional writing and erasing controls, the control circuit responds to a macro copy command and performs the control by employing the conventional read, write and erase sequences.

6 Claims, 6 Drawing Sheets

FLASH MEMORY WITH COPY AND TRANSFER FUNCTION

BACKGROUND OF THE INVENTION

1. Field of the Invention

The present invention relates to a flash memory having a function that can be performed by an external command for copying and transferring data in the memory and for combining data from a plurality of cell blocks.

2. Related Art

A flash memory is a non-volatile memory that uses transistors having floating gates. A non-volatile memory that uses floating gates was first developed as EPROM which could be totally erased by irradiating it with ultraviolet rays, however after that, by making it possible to erase the memory electrically, it evolved into a flash memory. Inside the flash memory is divided into a plurality of cell blocks, and it is erased together in units of cell blocks.

The flash memories that are currently popular on the market are capable of holding data when the power is OFF. For example, they are used as the medium for storing image data of a digital camera. In response to a "Write" command or "Erase" command from a memory controller, the flash memory automatically writes or erases data. Therefore, a control circuit is built in for decoding external commands and for performing the processes that correspond to those commands. This control circuit controls internal operations for "Read" commands as well.

For example, when a "Write" command is given for an erased cell block, specified write pulses are applied to memory cells corresponding to the write data and address, so that a charge is injected in the floating gate, and then write verify is performed to check the threshold voltage after the charge has being injected. This series of processes is then repeated. Also, when an "Erase" command is given, pre-programming (the aforementioned write process) is performed for cells that have not been written to, then an erase pulse is applied to all of the cell blocks together and erase verify is performed to check the threshold voltage. This series of processes is then repeated. Normally, writing is performed in 1-byte units.

However, the prior commands are designed for only writing data or erasing cell blocks. As mentioned above, it is expected that flash memories will be more widely used in the future for uses such as the storage medium for image data of digital cameras or as the storage medium for other portable terminals. In that case, for example, a function that would make it possible to copy data from one cell block to another cell block, or to transfer the data of one cell block to another cell block, or furthermore, to transfer part of the data from many cell blocks to another cell block and combine that data, is desired.

In prior flash memories with only a command function for writing or erasing, it is necessary for a memory controller to perform very complicated controls. For example, to copy within the memory device, first the data of the cell block to be copied must be read externally and stored by the system, then, it is necessary to write the externally stored data, while specifying the address of the cell block where the data are to be copied. Also, when the destination cell block is already written some data, it is necessary to first give an "Erase" command for the destination cell block.

When copying within the memory device, it is necessary for the system to perform the complicated processes mentioned above, which requires much time and steps.

Moreover, in the testing process of the memory, identical data may be written to all of the cell blocks and then read and checked whether written properly. In this case, it is necessary to repeat identical write control for several cell blocks, and in order to complete the writing to all of the blocks of the memory, it requires a large command instruction cycles which in turn require many processes and time.

SUMMARY OF THE INVENTION

The objective of the present invention is to provide a flash memory that is capable of copying, transfer and combining data in the memory with one or a few external commands, which could not be done in a prior flash memory.

In order to accomplish this objective, one example of the present invention provides a flash memory, having a plurality of non-volatile memory cells, comprising:

a plurality of cell blocks having said plurality of non-volatile memory cells, a data latch circuit, connected to said cell blocks, for storing data that is read from or written to a selected cell block, and a control circuit for, in response to an external copy command, erasing a copy destination cell block, reading data from a copy source cell block to store the data in said data latch circuit, and writing the stored data to said copy destination cell block.

In the aforementioned flash memory, when the system gives the address of the copy source cell block and the address of the copy destination cell block, checking and erasing of the copy destination cell block required for copying, reading of data from the copy source cell block and writing that data to the copy destination cell block are performed automatically inside the memory. In addition to the conventional writing and erasing controls, the control circuit responds to a macro copy command and performs the control by employing the conventional read, write and erase sequences.

Another example of the present invention provides a flash memory, having a plurality of non-volatile memory cells, comprising:

a plurality of cell blocks having said plurality of non-volatile cell memory cells, a data latch circuit, connected to said cell blocks, for storing data that is read from or written to a selected cell block, and a control circuit for, in response to an external transfer command, erasing a transfer destination cell block, reading data from a transfer source cell block to store the data in said data latch circuit, writing the stored data to said transfer cell block and erasing said transfer source cell block.

In the aforementioned flash memory, when the system gives the address of the transfer source cell block and the address of the transfer destination cell block, all necessary processes are performed automatically inside the memory. Therefore, the control unit responds to a transfer command, and in addition to the aforementioned copy process, it also erases the transfer source cell block.

Furthermore, another example of the present invention provides a flash memory, having a plurality of non-volatile memory cells, comprising:

a plurality of cell blocks having said plurality of non-volatile cell memory cells, a data latch circuit, connected to said cell blocks, for storing data that is read from or written to a selected cell block, and a control circuit for, in response to an external combine command, erasing a transfer destination cell block, reading data from a first transfer source cell block to store the data in said data latch circuit, writing the stored data in said transfer destination cell block, reading data from a second transfer source cell block to store the data in said data latch circuit, writing the stored data to said transfer destination cell block, and erasing said first and second transfer source cell blocks.

In the aforementioned flash memory, when the system gives a transfer command and a plurality of addresses of the transfer source cell blocks and addresses of the transfer destination cell blocks, the specified data are combined automatically inside the memory. In detail, the aforementioned process corresponding to the transfer command is repeated for the number transfer source cell blocks.

DESCRIPTION OF THE PREFERRED EMBODIMENTS

The preferred embodiments of the present invention are explained with reference to the drawings. However, the technical range of the invention is not limited to these embodiments.

Figure 1:
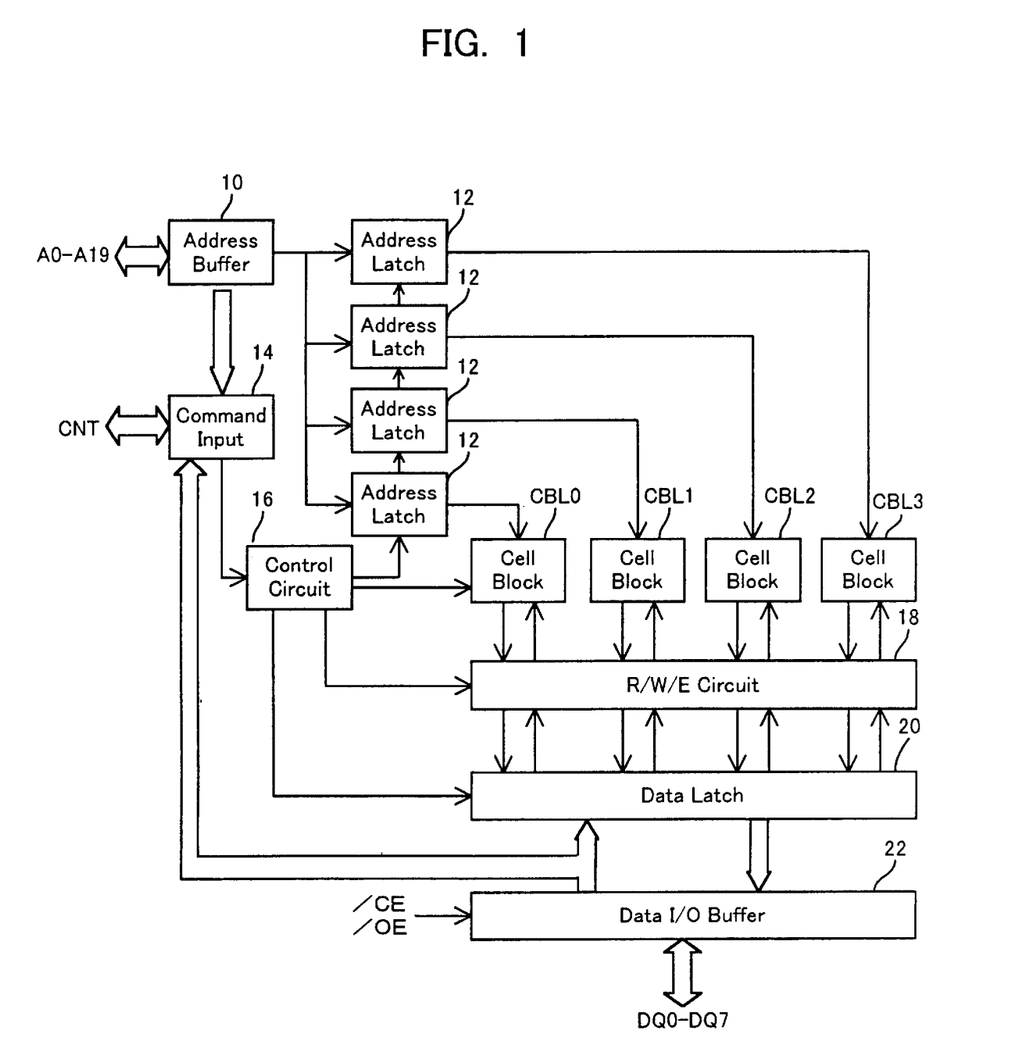
FIG. 1 is a drawing of the overall configuration of the flash memory of an embodiment of the present invention.

FIG. 1 is a drawing of the overall configuration of the flash memory of an embodiment of the present invention. The example in FIG. 1 comprises four cell blocks CBL0–CBL3. Addresses A0–A19 are supplied to an address buffer 10 and then stored in address latch circuits 12. There is an address latch circuit 12 for each cell block. On the other hand, in addition to a specified control signal CNT, command signals are supplied to a command input circuit 14 from the address buffer 10 and a data I/O buffer 22. The input command signals with fixed number of bits are then supplied to a control circuit 16.

The control circuit 16 controls the internal circuits in order to perform the copy operation, transfer operation and combine operation to be described below, in addition to the write operation (program), erase operation and read operation as a conventional flash memory. The cell blocks are connected to the read, write and erase circuit 18. This read, write and erase circuit 18 is controlled by the control circuit 16. I/O terminals DQ0–DQ7 are connected to the data I/O buffer 22. Write data is supplied to the I/O buffer 22 and stored in a data latch circuit 20 and then output to the I/O terminals DQ0–DQ7 from the data I/O buffer 22.

Figure 2:
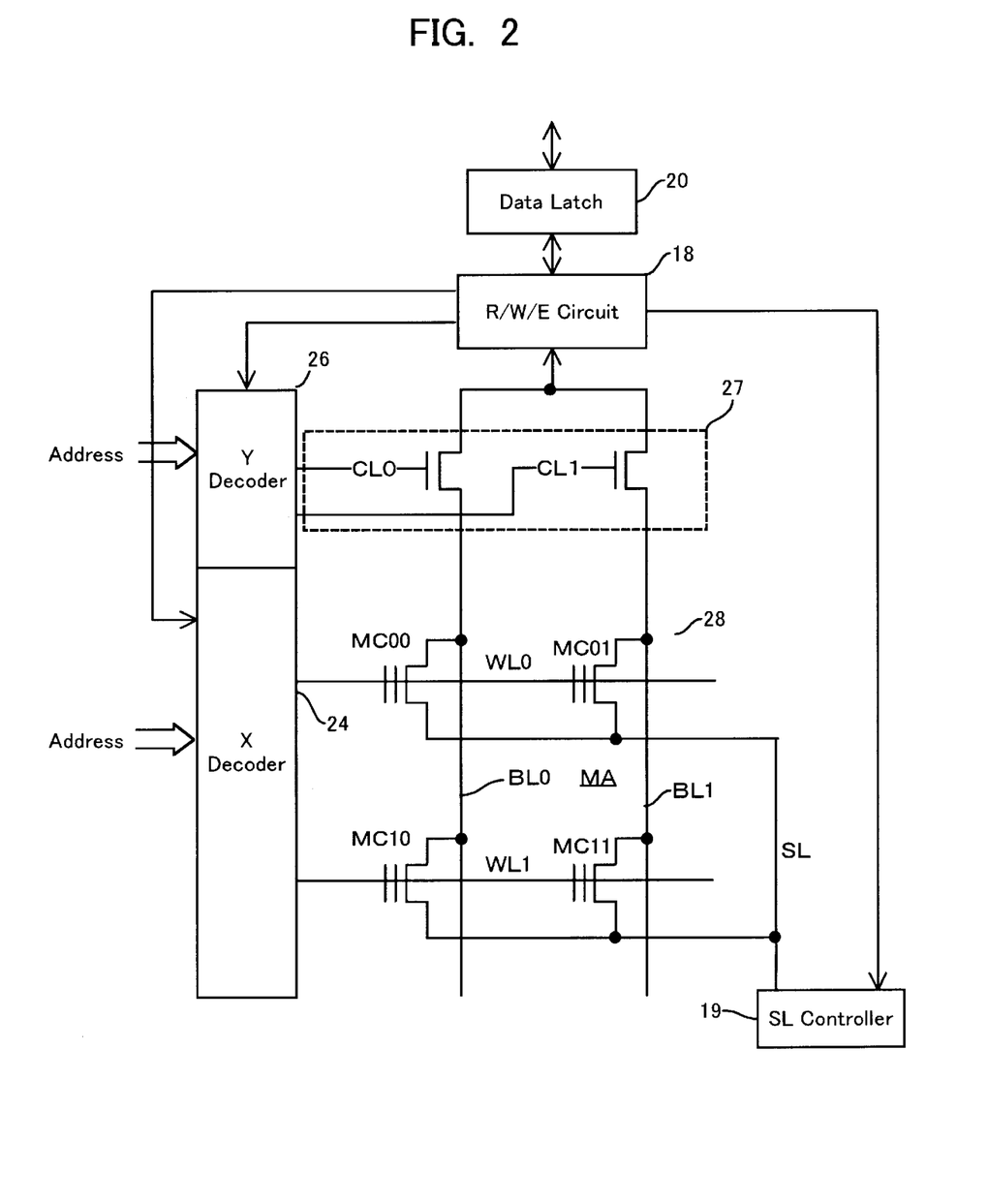
FIG. 2. is a drawing showing an example of the configuration of a cell block.

FIG. 2 is a drawing showing an example of the configuration of a cell block. The cell block comprises a cell array 28, X decoder 24, Y decoder 26 and Y gate 27. Inside the cell array 28, there are a plurality of word lines WL0, WL1 and bit lines BL0, BL1, and there is a memory cell MC00–MC11 at each location where they cross. The memory cells have floating gates, the control gates connected to the word lines, the drain connected to the bit lines, and sources connected to a source line. The word lines WL0, WL1 are selected by the X decoder 24 and driven to the prescribed voltage. The bit lines BL0, BL1 are connected to the read, write and erase circuit 18 by way of a column transistor that is selected inside the Y gate. The common source line SL is driven to the prescribed voltage by a source control circuit 19.

The driving voltage of the word line WL and the voltage of the source line are controlled by the read-write-erase circuit 18. Normally, in the write operation, the word line WL is driven to a Vpp level higher than the power supply, the source line SL is controlled at the ground potential, and the bit line BL is driven to a high level. As a result, a charge is injected in the floating gate of the cell transistor from the drain connected to the bit line, so that the threshold voltage of the cell transistor rises and data 0 is written.

During the erase operation, all of the memory cells in a cell block are pre-programmed to the high threshold voltage level. Then the erase operation is performed for all of the memory cells in the cell block simultaneously. In other words, a negative voltage is applied to all of the word lines in a cell block, the common source line SL is controlled at a high voltage and all of the bit lines are in a floating state. As a result, the charge is drawn from the floating gate to the source, the threshold voltage of the cell transistor becomes low, and all of the cell transistors are reset to the low threshold voltage level or data 1.

In this way, the erase operation performs preprogramming and erasing for each cell block. Also, in the write operation, first the stored data are erased, and a charge is injected only in cell transistors to which data 0 is to be written.

In the read operation, the word lines are driven to a prescribed voltage potential between the threshold voltages of data 0 and 1, the common source line is grounded, and whether or not cell transistor conducts is detected by the read-write-erase circuit 18. The detected read data is stored in the data latch circuit 20.

Figure 3:
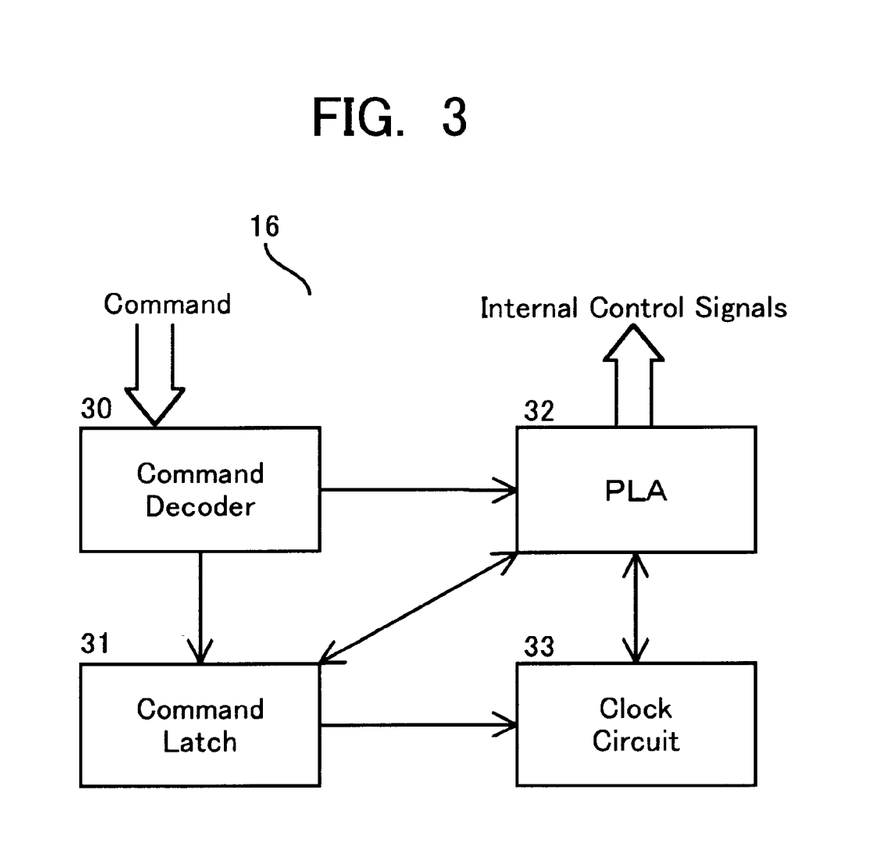
FIG. 3. is a drawing showing an example of the configuration-of the control circuit 16.

FIG. 3. is a drawing showing an example of the configuration of the control circuit 16 in FIG. 1. The control circuit 16 responds to the command signals that are supplied from the control signal terminal, address terminal and data I/O terminal, and at prescribed timing generates the required internal control signal. In order to this, the control circuit 16 comprises, for example, a command decoder 30, command latch 31, programmable logic array (PLA) 32 and clock circuit 33.

Sequence programs that correspond to the "Write", "Read" and "Erase" commands are recorded in the PLA 32. Furthermore, in this embodiment of the invention, sequence programs that correspond to the "Copy", "Transfer" and "Combine" commands are also recorded in the PLA 32. These commands are supplied by way of the command decoder 30, and by executing the sequence programs that correspond to them, the required internal control signals are output from the PLA 32.

The control circuit 16 does not necessarily have to be a logic circuit as shown in FIG. 3.

Figure 4:
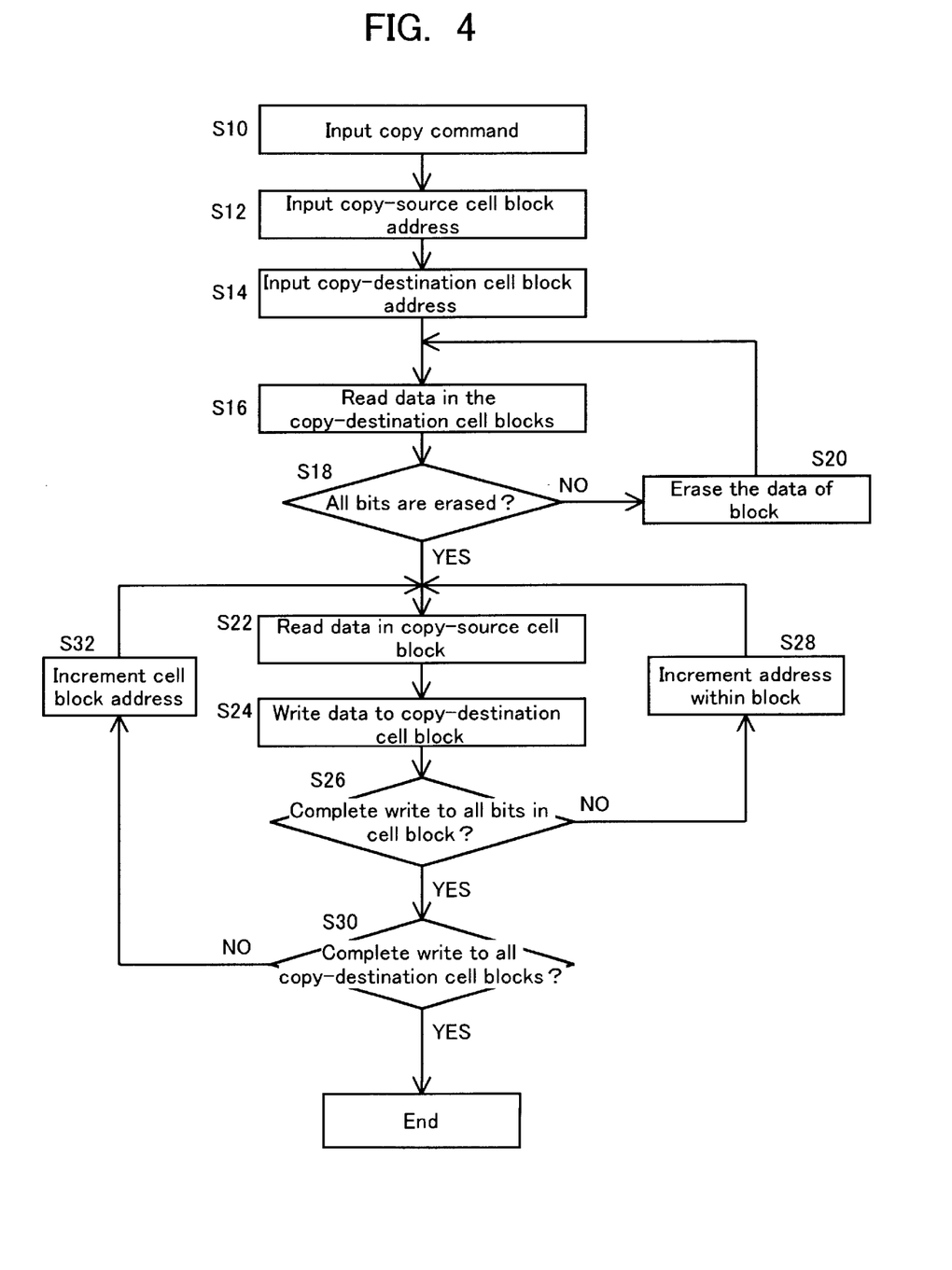
FIG. 4 is a flowchart of the process corresponding to the "Copy" command.

Copy Command:

FIG. 4 is a flowchart of the process corresponding to the "Copy" command. The sequence program that executes the process shown in the flowchart in FIG. 4 is stored in the PLA 32 of the control circuit 16.

The "Copy" operation in cell-block units will be explained using FIG. 4. First, a data "Copy" command having prescribed format is input to the command input circuit 14 from the control signal terminal CNT, address signal terminals A0–A19, and data signal terminals DQ0–DQ7 (S10). This "Copy" command is supplied to the control circuit 16. This designates the copy operation. Next, the address of the copy-source cell block is input. After it is input, a command is input to designate the copy-source cell block, and the designated cell block is confirmed (S12). The input copy-source cell block address is stored in the respective address latch circuit 12.

Next, the copy-destination cell block address is input. When there are more than copy-destination cell block addresses, those cell block addresses are input in succession. The copy destination is then confirmed by inputting a prescribed set command. The copy-destination cell block address is latched in the address latch circuit 12 (S14). In this explanation, an example of copying the data of cell block CBL3 to cell blocks CBL0, CBL1, CBL2 is explained.

The data of the copy-destination cell blocks CBL0–CBL2 are read in order according to the sequence program in the control circuit 16, and checked whether or not all bits of data in the cell blocks are erased (data 1) (S18). When not erased, the data of the appropriate cell block are erased by the conventional "Erase" command (S20). This process S18, S20 is performed for all copy-destination cell blocks.

After all of the copy-destination cell blocks have been erased, data of the copy-source cell block CBL3 is read (S22). This read operation is controlled in the same way as the conventional read operation, and the read data are stored in the data latch circuit 20. The stored read data is then written to the copy-destination cell block CBL0 (S24). This write operation is controlled in the same way as the conventional write operation. The aforementioned steps of reading data from the copy-source cell block CBL3 (S22) and the process of writing data to the copy-destination cell block CBL0 (S24) are repeated for all of the bits of the cell block (S26, S28). In order to repeat the operation, the cell address in the address latch circuit 12 is incremented by the control circuit 16 (S28).

The aforementioned processes S22, S24, S26, S28 are repeated until all of copy-destination cell blocks have been written to (S30, S32). After copying to a cell blocks is finished, control is incremented to the next cell block (S32).

As described above, the copy operation comprises checking the erasure state of the copy-destination cell block, incrementing the addresses in the copy-source and copy-destination cell blocks, and incrementing the copy-destination cell block, as well as a combination of the conventional read operation, erase operation and write operation.

Figure 5:
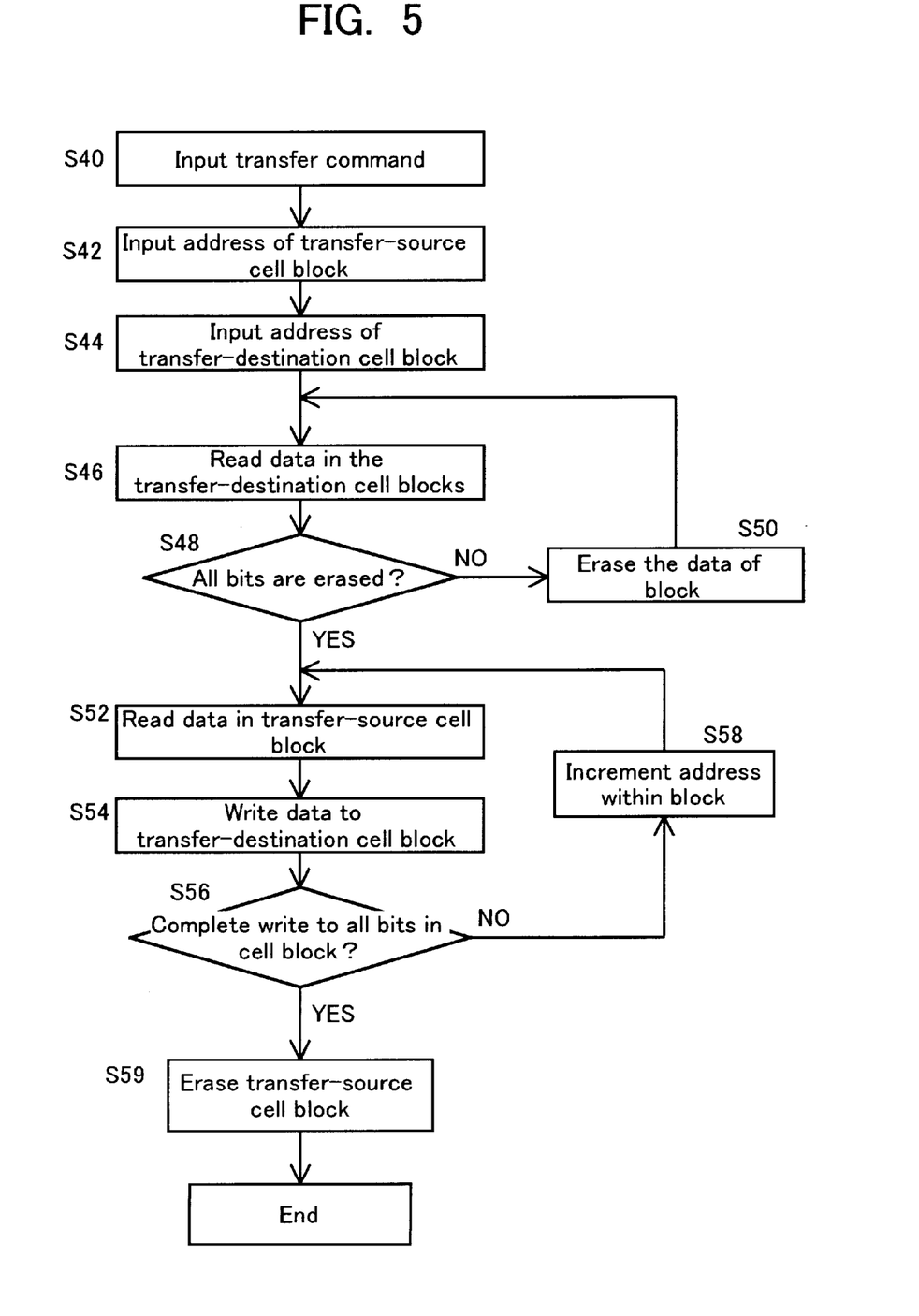
FIG. 5 is a flowchart of the process corresponding to the "Transfer" command.

Transfer Command:

FIG. 5 is a flowchart of the process corresponding to the "Transfer" command. Similar to the "Copy" command, the "Transfer" command having a prescribed data combination is input to the command input circuit 14 and the transfer operation is set (S40).

Next, the address of the transfer-source cell block is input, after which a command to set the transfer-source cell block is input and the transfer-source cell block is set (S42). The input transfer-source cell block address is stored in the respective address latch circuit 12.

Next, the address of the transfer-destination cell block is input and the transfer destination is set by a prescribed confirmation command. This address of the transfer-destination cell block is latched in the address latch circuit 12 (S44). As an example, transferring the data of the cell block CBL3 to the cell block CBL0 is explained.

The data in the transfer-destination cell block CBL0 are continuously read according to the sequence program in the control circuit 16 (S46), and checked whether or not all of the bits of data in the cell block are erased (data 1) (S48), and when not erased, the appropriate cell block data are erased by the conventional erase operation (S50). When a plurality of transfer-destination cell blocks are specified, this process S48, S50 is performed for all of the transfer-destination cell blocks.

After the transfer-destination cell block has been erased, the data of the transfer-source cell block CBL3 are read (S52). This read operation is controlled in the same way as the convention read operation, and the read data are stored in the data latch circuit 20. The stored read data are then written to the transfer-destination cell block CBL0 (S54). This write operation is controlled in the same way as the conventional write operation. The aforementioned process of reading data of the transfer-source cell block CBL3 (S52) and process of writing data to the transfer-destination cell block CBL0 (S54) are repeated until performed for all of the bits in the cell block (S52, S58). In order to repeat the operation, the address in both cell blocks CBL3, CBL0 in the address latch circuit 12 are incremented by the control circuit 16 (S58).

The transfer operation differs from the copy operation in that at the end the erase operation is performed for the transfer-source cell block (S59). This erase operation is the same as the conventional erase operation.

As described above, similar to the copy operation, the transfer operation comprises checking the erasure state of the transfer-destination cell block, and incrementing the addresses in the transfer-source and transfer-destination cell blocks, as well as a combination of the conventional read operation, erase operation and write operation.

Combine Command:

The "Combine" command is a command for writing data from a plurality of transfer-source cell blocks to one transfer-destination cell block. It is expected that this command would be used for cleaning cell blocks when the amount of data written in an area of a plurality of cell blocks could be recorded in one cell block.

The processing sequence for the "Combine" command is basically the same as the processing sequence for the "Transfer" command. However, in the case of the "Combine" command, since there are a plurality of transfer-source cell blocks, those addresses are all input and the transfer process is performed for a plurality of transfer-source cell blocks.

Figure 6:
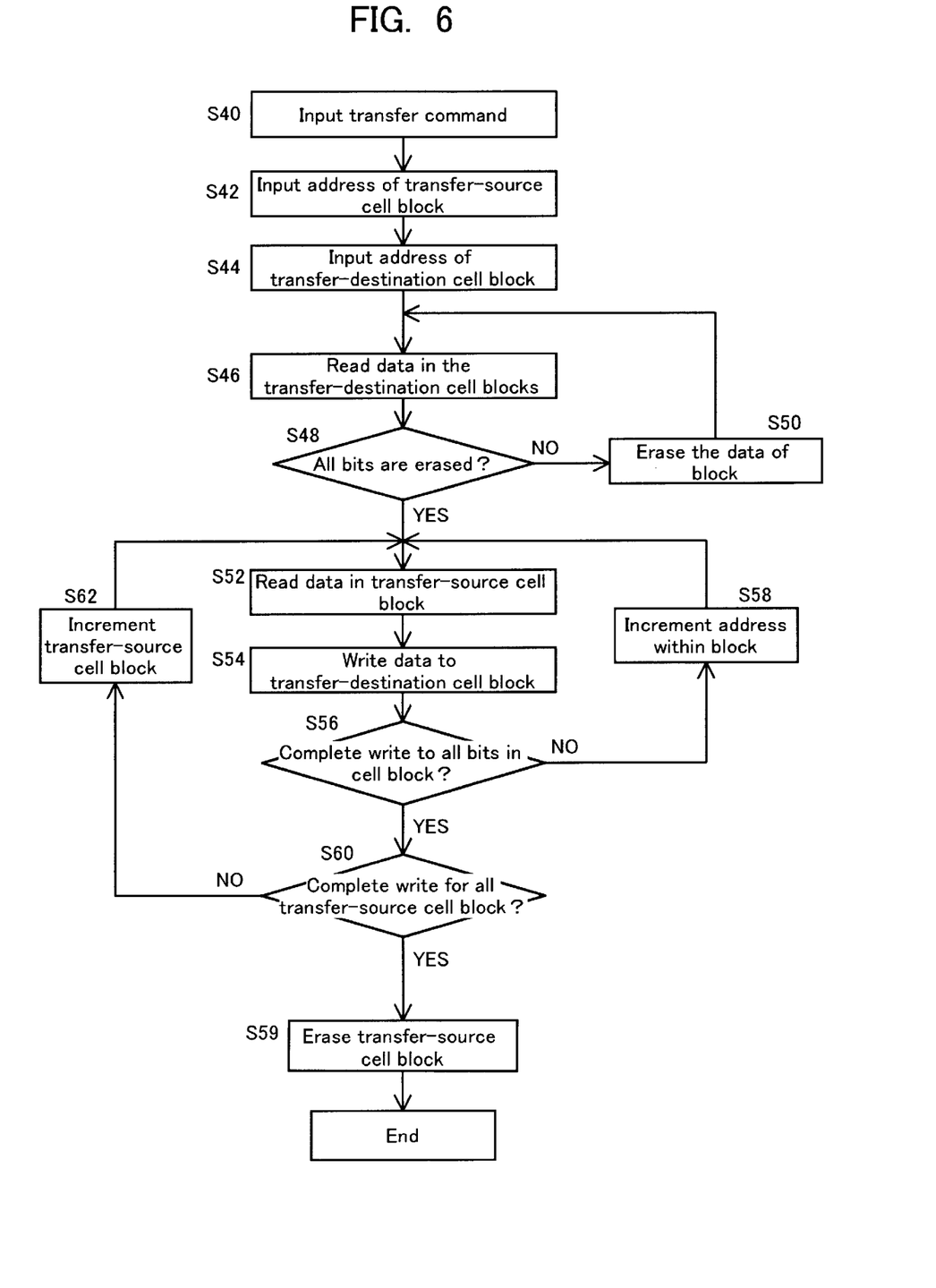
FIG. 6 is a flowchart of the process corresponding to the "Combine" command.

FIG. 6 is a flowchart of the process corresponding to the "Combine" command. It is very similar to the flowchart for the "Transfer" command, so the same numbers are given to processes that correspond to those in FIG. 5.

First, the "Transfer" command is input (S40). The "Combine" command is the same as the "Transfer" command having a plurality of transfer-source cell blocks. In this example of the embodiment, the "Combine" command will be performed by the "Transfer" command. The addresses of the transfer-source cell blocks are also input (S42). Addressed for a plurality of transfer-source cell blocks are input in succession, and finally the transfer-source cell blocks are set by the transfer-source cell block set command.

Next, in the same way as the "Transfer" command, the address of the transfer-destination cell block is input (S44), and the erasure status of the transfer-destination cell block is checked and when necessary, the cell block is erased (S46, S48, S50). In this explanation, the data from cell blocks CBL1–CBL3 are combined in cell block CBL0.

The data from the first transfer-source cell block are read (S52) and stored in the data latch circuit 20. The read data are then written in the transfer-destination cell block (S54). By the time the data in the transfer-source cell block have been written (S56), the address in the block is incremented (S58), and the aforementioned read process S52 and write process S54 are repeated.

In the case of the "Combine" command, data are read from the transfer-source cell block and written to the transfer-destination cell block, however this is performed for a plurality of transfer-source cell blocks. Also, by the time data have been written to the transfer-destination block (S60), the transfer-source block is incremented (S62), and data from the transfer-source cell blocks is read in order and written to the transfer-destination cell block.

Lastly, as in the case of the "Transfer" command, the transfer-source cell block is erased (S59). However, in the case of the "Combine", there are a plurality of transfer-source blocks, so this erase operation S59 is performed for a plurality of cell blocks.

As described above, the "Combine" command also comprises the conventional read, write and erase operations, as well as incrementing the transfer-source cell block and incrementing the addresses in the transfer-source cell block and transfer-destination cell block.

In addition to the conventional write, read and erase operation sequences, by having sequences in the control circuit for the "Copy" command, "Transfer" command, and "Transfer" command for a plurality of cell blocks ("Combine" command) as described above, it is possible to increase the functionability of the flash memory, and reduce the load on the external memory controller and the like on the system side. Also, when writing identical data to all cell blocks inside a memory device, the write operation only needs to be performed for one cell block, and then such data can be copied to the others by just giving the "Copy" command. This makes it possible to reduce the load on the system like the memory controller. Moreover, by using the "Transfer" command for a plurality of cell blocks ("Combine" command), it is possible to rearrange the cell blocks of the memory device, making it possible to more efficiently use the limited memory capacity.

With the present invention, it is possible to perform copy, transfer or combine data in the memory device in units of cell blocks by just giving the respective command as well as the address of the copy or transfer source, and address of the copy or transfer destination.

The range of this invention is not limited by the embodiments described above covers the invention disclosed in the claims and anything equivalent to it.

What is claimed is:

1. A flash memory, having a plurality of non-volatile memory cells, comprising:

a plurality of cell blocks having said plurality of non-volatile memory cells, a data latch circuit, connected to said cell blocks, for storing data that is read from or written to a selected cell block, and a control circuit for, in response to an external copy command, erasing a copy destination cell block, reading data from a copy source cell block to store the data in said data latch circuit, and writing the stored data to said copy destination cell block.

2. The flash memory of claim 1 wherein said control circuit in response to said commands reads and checks the erasure status of said copy destination cell block, and when not erased, erases said copy destination cell block.

3. A flash memory, having a plurality of non-volatile memory cells, comprising:

a plurality of cell blocks having said plurality of non-volatile memory cells, a data latch circuit, connected to said cell blocks, for storing data that is read from or written to a selected cell block, and a control circuit for, in response to an external transfer command, erasing a transfer destination cell block, reading data from a transfer source cell block to store the data in said data latch circuit, writing the stored data to said transfer destination cell block and erasing said transfer source cell block.

4. The flash memory of claim 3 wherein said control circuit in response to said commands reads and checks the erasure status of said transfer destination cell block, and when not erased, erases said transfer destination cell block.

5. A flash memory, having a plurality of non-volatile memory cells, comprising:

a plurality of cell blocks having said plurality of non-volatile memory cells, a data latch circuit, connected to said cell blocks, for storing data that is read from or written to a selected cell block, and a control circuit for, in response to an external combine command, erasing a transfer destination cell block, reading data from a first transfer source cell block to store the data in said data latch circuit, writing the stored data to said transfer destination cell block, reading data from a second transfer source cell block to store the data in said data latch circuit, writing the stored data to said transfer destination cell block, and erasing said first and second transfer source cell blocks.

6. The flash memory of claim 5 wherein said control circuit in response to said commands reads and checks the erasure status of said transfer destination cell blocks, and when not erased, erases said transfer destination cell blocks.

* * * * *